(12) United States Patent
Choi et al.

(10) Patent No.: US 10,483,494 B2
(45) Date of Patent: Nov. 19, 2019

(54) ENCAPSULATION STRUCTURE FOR TRANSPARENT FLEXIBLE ORGANIC ELECTRONIC DEVICE

(71) Applicant: KOREA ADVANCED INSTITUTE OF SCIENCE AND TECHNOLOGY, Daejeon (KR)

(72) Inventors: Kyung Cheol Choi, Daejeon (KR); Jeong Hyun Kwon, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 16/101,583

(22) Filed: Aug. 13, 2018

(65) Prior Publication Data

US 2019/0058157 A1    Feb. 21, 2019

(30) Foreign Application Priority Data

Aug. 18, 2017 (KR) .................. 10-2017-0105065
Jul. 5, 2018 (KR) .................. 10-2018-0078434

(51) Int. Cl.
*H01L 23/02* (2006.01)
*H01L 51/52* (2006.01)
*H01L 51/56* (2006.01)
*H01L 51/00* (2006.01)

(52) U.S. Cl.
CPC ...... *H01L 51/5253* (2013.01); *H01L 51/0097* (2013.01); *H01L 51/5256* (2013.01); *H01L 51/56* (2013.01); *H01L 2251/5338* (2013.01)

(58) Field of Classification Search
CPC .......................... H01L 51/0097; H01L 51/56
See application file for complete search history.

(56) References Cited

U.S. PATENT DOCUMENTS

| | | | |
|---|---|---|---|
| 2011/0121355 A1* | 5/2011 | Bae | H01L 51/5253 257/100 |
| 2015/0108535 A1* | 4/2015 | Park | H01L 51/5256 257/100 |

* cited by examiner

*Primary Examiner* — Hsien Ming Lee
(74) *Attorney, Agent, or Firm* — MAYER & WILLIAMS, PC; Stuart H. Mayer

(57) ABSTRACT

Provided is an encapsulation structure for a transparent flexible organic electronic device, the encapsulation structure including a flexible substrate, and at least one hybrid unit structure provided on at least one surface of the flexible substrate and including a zinc oxide thin film, an aluminum oxide thin film, and a magnesium oxide thin film stacked on one another.

18 Claims, 17 Drawing Sheets

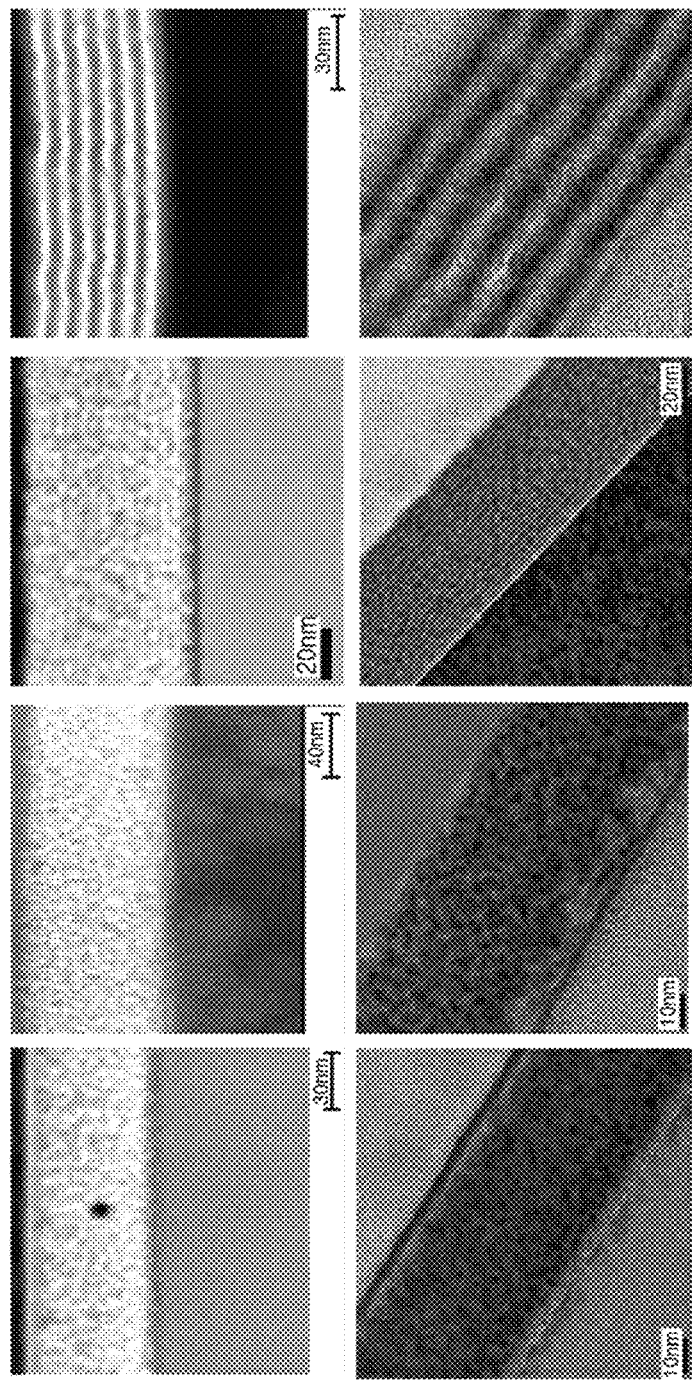

ENCAPSULATION STRUCTURE FOR TRANSPARENT FLEXIBLE ORGANIC ELECTRONIC DEVICE

CROSS-REFERENCE TO RELATED PATENT APPLICATIONS

This application claims the benefit of Korean Patent Application No. 10-2017-0105065, filed on Aug. 18, 2017, and Korean Patent Application No. 10-2018-0078434, filed on Jul. 5, 2018, in the Korean Intellectual Property Office, the disclosure of which is incorporated herein in its entirety by reference.

BACKGROUND

1. Field

The present invention relates to an encapsulation structure and, more particularly, to an encapsulation structure for a transparent flexible organic electronic device.

2. Description of the Related Art

A single-material inorganic thin film provided on or under a plastic substrate for a transparent flexible organic light-emitting diode (OLED) device, and on the device has excellent characteristics as a protective film. However, the single-material inorganic thin film has an uneven surface and is easily breakable due to bending stress when the thickness thereof is increased, and thus may not be easily solely used for a flexible electronic device. A protective film capable of ensuring flexibility by stacking flexible organic thin films on one another is also being developed. Although research is being actively conducted on foldable, stretchable, and wearable devices based on continuous development of display technology, known organic and inorganic stack structures do not satisfy mechanical properties due to limitations of inorganic materials having high brittleness values.

SUMMARY

The present invention provides an encapsulation structure used for a transparent flexible organic electronic device and including a thin film capable of not only achieving high barrier characteristics corresponding to a low water vapor transmission rate (WVTR) value but also achieving a high transmittance equal to or greater than 95%, a high flexibility, and a low stress. However, the scope of the present invention is not limited thereto.

According to an aspect of the present invention, there is provided an encapsulation structure for a transparent flexible organic electronic device, the encapsulation structure including a flexible substrate, and at least one hybrid unit structure provided on at least one surface of the flexible substrate and including a zinc oxide thin film, an aluminum oxide thin film, and a magnesium oxide thin film stacked on one another.

In the at least one hybrid unit structure, the zinc oxide thin film, the aluminum oxide thin film, and the magnesium oxide thin film may individually have pinholes, and have a pinhole decoupling structure in which the pinholes of adjacent thin films among the zinc oxide thin film, the aluminum oxide thin film, and the magnesium oxide thin film are misaligned.

In the at least one hybrid unit structure, the aluminum oxide thin film and the magnesium oxide thin film may be stacked on one another to contact each other.

In the at least one hybrid unit structure, the zinc oxide thin film and the aluminum oxide thin film may be stacked on one another to contact each other in such a manner that the zinc oxide thin film is located at a lower side and the aluminum oxide thin film is located at an upper side.

The at least one hybrid unit structure may include a plurality of hybrid unit structures, and a pinhole decoupling structure may occur at a boundary between the hybrid unit structures such that pinholes of a hybrid unit structure are misaligned with pinholes of an adjacent hybrid unit structure.

The at least one hybrid unit structure may include a first hybrid unit structure and a second hybrid unit structure in contact with each other, and the aluminum oxide thin film of the first hybrid unit structure and the magnesium oxide thin film of the second hybrid unit structure may be stacked on one another to contact each other at a boundary between the first hybrid unit structure and the second hybrid unit structure.

The at least one hybrid unit structure may include a first hybrid unit structure and a second hybrid unit structure in contact with each other, and the zinc oxide thin film of the first hybrid unit structure and the aluminum oxide thin film of the second hybrid unit structure may be stacked on one another to contact each other at a boundary between the first hybrid unit structure and the second hybrid unit structure in such a manner that the zinc oxide thin film is located at a lower side and the aluminum oxide thin film is located at an upper side.

The zinc oxide thin film may include a ZnO thin film, the aluminum oxide thin film may include an $Al_2O_3$ thin film, and the magnesium oxide thin film may include a MgO thin film.

In a hybrid unit structure, the aluminum oxide thin film may be an ultra thin film having pinholes and having a thickness of 0.1 nm to 2 nm, the magnesium oxide thin film may be an ultra thin film having pinholes and having a thickness of 0.1 nm to 2 nm, and the zinc oxide thin film may be an ultra thin film having pinholes and having a thickness of 0.1 nm to 30 nm.

According to another aspect of the present invention, there is provided an encapsulation structure for a transparent flexible organic electronic device, the encapsulation structure including a flexible substrate, and at least one hybrid unit structure provided on at least one surface of the flexible substrate and including a stress relief film, a barrier film, and a moisture absorbing film stacked on one another, wherein, in the at least one hybrid unit structure, the stress relief film, the barrier film, and the moisture absorbing film individually have pinholes, and have a pinhole decoupling structure in which the pinholes of adjacent thin films among the stress relief film, the barrier film, and the moisture absorbing film are misaligned.

The barrier film may be a thin film including at least one of AlN, $Al_2O_3$, $AlO_xN_y$, and $SnO_x$, the moisture absorbing film may be a thin film including at least one selected among alkali metals including lithium (Li), sodium (Na), potassium (K), rubidium (Rb), cesium (Cs), and francium (Fr), alkaline earth metals including beryllium (Be), magnesium (Mg), calcium (Ca), strontium (Sr), barium (Ba), and radium (Ra), titanium (Ti), zirconium (Zr), hafnium (Hf), and oxides thereof, and the stress relief film may be a thin film including at least one selected among ZnO, $SiO_2$, $SiN_x$, silver (Ag), and aluminum (Al).

In a hybrid unit structure, the barrier film may be an ultra thin film having a thickness of 0.1 nm to 2 nm, the moisture absorbing film may be an ultra thin film having a thickness of 0.1 nm to 2 nm, and the stress relief film may be an ultra thin film having a thickness of 0.1 nm to 30 nm.

The at least one hybrid unit structure may include a plurality of hybrid unit structures, and a pinhole decoupling structure may occur at a boundary between the hybrid unit structures such that pinholes of a hybrid unit structure are misaligned with pinholes of an adjacent hybrid unit structure.

The flexible substrate may include at least one of a polymer substrate, a fiber substrate, and a fabric substrate.

The encapsulation structure may further include an organic thin film provided on at least one of top and bottom surfaces of the hybrid unit structure. The organic thin film may include at least one of parylene-based resin, polyethylene resin, polyimide resin, acryl-based resin, epoxy-based resin, and polymethyl methacrylate (PMMA).

According to another aspect of the present invention, there is provided a method of manufacturing an encapsulation structure for a transparent flexible organic electronic device, the method including generating, on at least one surface of a flexible substrate, at least one hybrid unit structure including a zinc oxide thin film, an aluminum oxide thin film, and a magnesium oxide thin film stacked on one another, wherein the zinc oxide thin film is generated using atomic layer deposition (ALD), chemical vapor deposition (CVD), molecular layer deposition (MLD), or physical vapor deposition (PVD), wherein the aluminum oxide thin film is generated using ALD, CVD, MLD, or PVD, and wherein the magnesium oxide thin film is generated using ALD, CVD, MLD, or PVD.

In a hybrid unit structure, the aluminum oxide thin film may be an ultra thin film having pinholes and having a thickness of 0.1 nm to 2 nm, the magnesium oxide thin film may be an ultra thin film having pinholes and having a thickness of 0.1 nm to 2 nm, and the zinc oxide thin film may be an ultra thin film having pinholes and having a thickness of 0.1 nm to 30 nm, and, in the at least one hybrid unit structure, the zinc oxide thin film, the aluminum oxide thin film, and the magnesium oxide thin film may have a pinhole decoupling structure in which pinholes of adjacent thin films among the zinc oxide thin film, the aluminum oxide thin film, and the magnesium oxide thin film are misaligned.

In a hybrid unit structure, the aluminum oxide thin film may be an ultra thin film having pinholes and having a thickness of 0.1 nm to 2 nm, the magnesium oxide thin film may be an ultra thin film having pinholes and having a thickness of 0.1 nm to 2 nm, and the zinc oxide thin film may be an ultra thin film having pinholes and having a thickness of 0.1 nm to 30 nm, the at least one hybrid unit structure may include a plurality of hybrid unit structures, and a pinhole decoupling structure may occur at a boundary between the hybrid unit structures such that pinholes of a hybrid unit structure are misaligned with pinholes of an adjacent hybrid unit structure.

The zinc oxide thin film may include a ZnO thin film, the aluminum oxide thin film may include an $Al_2O_3$ thin film, and the magnesium oxide thin film may include a MgO thin film.

BRIEF DESCRIPTION OF THE DRAWINGS

The above and other features and advantages of the present invention will become more apparent by describing in detail embodiments thereof with reference to the attached drawings in which:

FIGS. 6A to 6D are transmission electron microscopy (TEM) images of cross-sections of encapsulation structures for a transparent flexible organic electronic device, according to embodiments of the present invention;

DETAILED DESCRIPTION

Figure 1A:
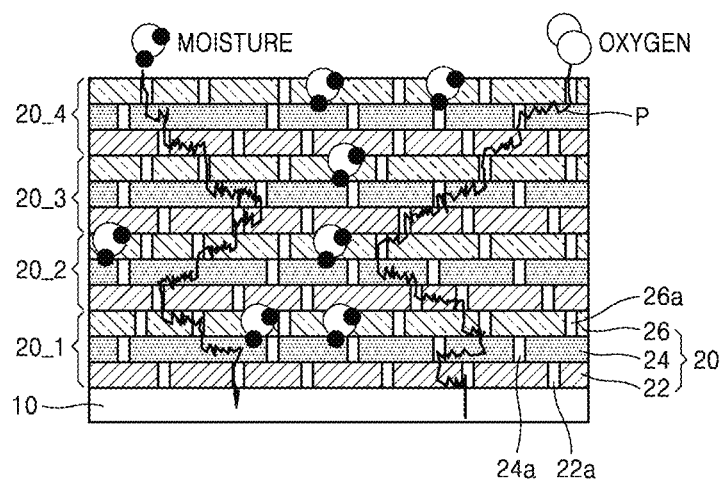
FIGS. 1A and 1B are cross-sectional views comparatively showing moisture and/or oxygen permeation paths in encapsulation structures for a transparent flexible organic electronic device, according to an embodiment (FIG. 1A) and a comparative example (FIG. 1B) of the present invention.

Hereinafter, the present invention will be described in detail by explaining embodiments of the invention with reference to the attached drawings. Throughout the specification, it will be understood that when an element, such as a layer, a region, or a substrate, is referred to as being "on" another element, it may be directly on the other element or intervening elements may be present. In contrast, when an element is referred to as being "directly on" another element, there are no intervening elements present.

In the drawings, variations from the shapes of the illustrations as a result, for example, of manufacturing techniques and/or tolerances, are to be expected. Thus, the embodiments of the invention should not be construed as limited to the particular shapes of regions illustrated herein, but are to include deviations in shapes that result, for example, from manufacturing. The thicknesses or sizes of layers may be exaggerated for clarity of explanation, and like reference numerals denote like elements.

In this specification and the drawings, 'ZAM' indicates an encapsulation structure used for a transparent flexible organic electronic device and including at least one hybrid unit structure including a zinc oxide thin film, an aluminum oxide thin film, and a magnesium oxide thin film stacked on one another.

Figure 1B:
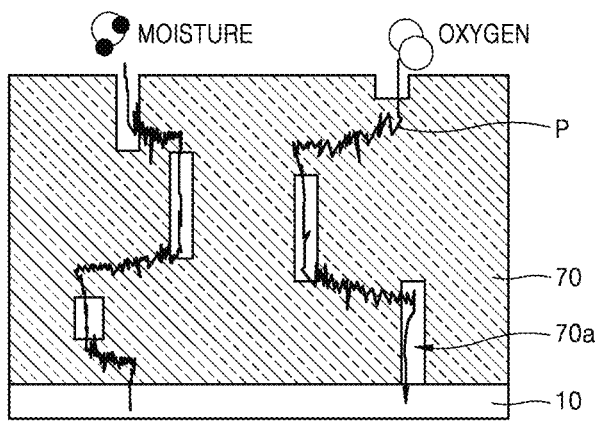

FIGS. 1A and 1B are cross-sectional views comparatively showing moisture and/or oxygen permeation paths in encapsulation structures for a transparent flexible organic electronic device, according to an embodiment (FIG. 1A) and a comparative example (FIG. 1B) of the present invention.

Referring to FIG. 1A, the encapsulation structure according to an embodiment of the present invention includes a flexible substrate 10, and at least one hybrid unit structure 20 on at least one surface of the flexible substrate 10.

The flexible substrate 10 may include at least one of a polymer substrate, a fiber substrate, and a fabric substrate. The polymer substrate may include at least one of polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose triacetate (TAC), and cellulose acetate propionate (CAP). The fiber substrate may include at least one of natural fiber, e.g., cotton and silk, and artificial fiber, e.g., PET, polypropylene (PP), PI, polystyrene (PS), PES, polyetheretherketone (PEEK), polymethyl methacrylate (PMMA), parylene, and acryl-based polymer, having a circular, oval, or polygonal shape. The fabric substrate may be generated by crossing horizontal and vertical weaving threads of natural fiber such as cotton or silk based on a certain rule, for example, perpendicularly.

The hybrid unit structure 20 includes an aluminum oxide thin film 22, a zinc oxide thin film 24, and a magnesium oxide thin film 26 stacked on one another. The aluminum oxide thin film 22, the zinc oxide thin film 24, and the magnesium oxide thin film 26 of the hybrid unit structure 20 may be stacked in an arbitrary order. The zinc oxide thin film 24 may include a ZnO thin film, the aluminum oxide thin film may include an $Al_2O_3$ thin film, and the magnesium oxide thin film may include a MgO thin film. For example, the hybrid unit structure 20 may include $ZnO/Al_2O_3/MgO$, $ZnO/MgO/Al_2O_3$, $MgO/Al_2O_3/ZnO$, $MgO/ZnO/Al_2O_3$, $Al_2O_3/ZnO/MgO$, or $Al_2O_3/MgO/ZnO$ sequentially stacked on the flexible substrate 10. In the hybrid unit structure 20, the aluminum oxide thin film 22 may serve as a barrier film for preventing permeation of moisture and/or oxygen, the zinc oxide thin film 24 may serve as a stress relief film for relieving stress of the hybrid unit structure 20, and the magnesium oxide thin film 26 may serve as a moisture absorbing film for preventing a hydrolysis phenomenon of the aluminum oxide thin film 22. Each of the aluminum oxide thin film 22, the zinc oxide thin film 24, and the magnesium oxide thin film 26 has defects such as pinholes.

In the encapsulation structure according to an embodiment of the present invention, at least one hybrid unit structure 20 may be provided. For example, in FIG. 1A, a stack of a plurality of hybrid unit structures, e.g., a first hybrid unit structure 20_1, a second hybrid unit structure 20_2, a third hybrid unit structure 20_3, and a fourth hybrid unit structure 20_4, may be provided.

In each hybrid unit structure 20, the aluminum oxide thin film 22, the zinc oxide thin film 24, and the magnesium oxide thin film 26 respectively have first to third pinholes 22a, 24a, and 26a, and have a pinhole decoupling structure in which pinholes of adjacent thin films among the aluminum oxide thin film 22, the zinc oxide thin film 24, and the magnesium oxide thin film 26 are misaligned.

For example, the first hybrid unit structure 20_1 has a pinhole decoupling structure in which the second pinholes 24a of the zinc oxide thin film 24 are relatively misaligned with the first and third pinholes 22a and 26a of the aluminum oxide thin film 22 and the magnesium oxide thin film 26 adjacent to the zinc oxide thin film 24. The pinhole decoupling structure occurs not only in the first hybrid unit structure 20_1 but also in the second to fourth hybrid unit structures 20_2 to 20_4, and occurs at boundaries between the first to fourth hybrid unit structures 20_1 to 20_4.

In each hybrid unit structure 20, the aluminum oxide thin film 22 may be an ultra thin film having a thickness of 0.1 nm to 2 nm, the magnesium oxide thin film 26 may be an ultra thin film having a thickness of 0.1 nm to 2 nm, and the zinc oxide thin film 24 may be an ultra thin film having a thickness of 0.1 nm to 30 nm.

The inventors have verified that, when a plurality of very thin films having different characteristics and having pinholes are provided in a stack structure, a pinhole decoupling structure may be implemented and thus permeation of moisture and/or oxygen may be greatly slowed down.

Referring to FIG. 1B, the encapsulation structure according to the comparative example of the present invention includes the flexible substrate 10, and a protective film 70 configured as a single material film on a surface of the flexible substrate 10.

When the protective film 70 configured as a single material film is generated, since pinholes 70a grow together with the protective film 70 from initially generated positions thereof and thus have relatively large sizes, moisture and/or oxygen may easily permeate. That is, lengths of permeation paths P of moisture and/or oxygen in the encapsulation structure illustrated in FIG. 1A are greater than the lengths of permeation paths P of moisture and/or oxygen in the encapsulation structure illustrated in FIG. 1B. Therefore, compared to the encapsulation structure illustrated in FIG. 1B, the encapsulation structure illustrated in FIG. 1A may effectively prevent permeation of moisture and/or oxygen.

FIGS. 2A to 2D are sequential cross-sectional views for describing a method of manufacturing an encapsulation structure for a transparent flexible organic electronic device, according to an embodiment of the present invention.

Figure 2A:
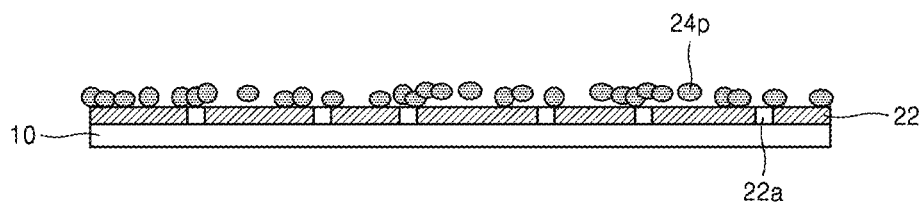
FIGS. 2A to 2D are sequential cross-sectional views for describing a method of manufacturing an encapsulation structure for a transparent flexible organic electronic device, according to an embodiment of the present invention.
Figure 2B:
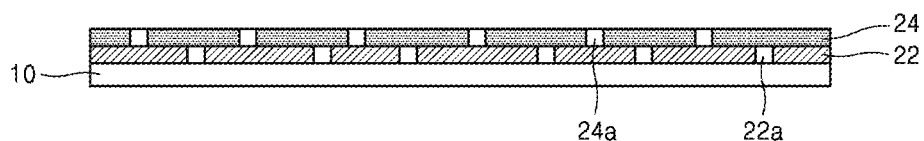

Referring to FIGS. 2A and 2B, the aluminum oxide thin film 22 is generated on the flexible substrate 10. The aluminum oxide thin film 22 may be generated using, for example, atomic layer deposition (ALD), chemical vapor deposition (CVD), molecular layer deposition (MLD), or physical vapor deposition (PVD). The aluminum oxide thin film 22 may be an ultra thin film having a thickness of 0.1 nm to 2 nm and, in this case, the first pinholes 22a penetrating through the aluminum oxide thin film 22 may be generated. Subsequently, the zinc oxide thin film 24 is generated on the aluminum oxide thin film 22. The zinc oxide thin film 24 may be generated using, for example, ALD, CVD, MLD, or PVD. In ALD or CVD, the zinc oxide thin film 24 may be generated by providing a ZnO precursor 24p onto the aluminum oxide thin film 22. The zinc oxide thin film 24 may be an ultra thin film having a thickness of 0.1 nm to 30 nm and, in this case, the second pinholes 24a penetrating through the zinc oxide thin film 24 may be generated. Stochastically, a possibility of misalignment between the first and second pinholes 22a and 24a is much higher than a possibility of alignment therebetween.

Figure 2C:
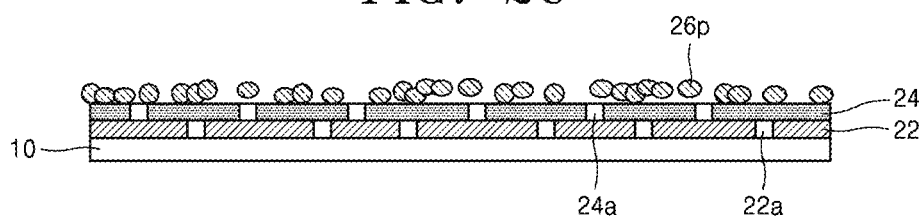
Figure 2D:
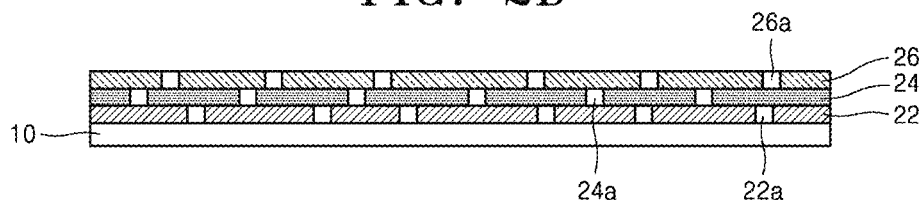

Referring to FIGS. 2C and 2D, the magnesium oxide thin film 26 is generated on the zinc oxide thin film 24. The magnesium oxide thin film 26 may be generated using, for example, ALD, CVD, MLD, or PVD. In ALD or CVD, the magnesium oxide thin film 26 may be generated by providing a magnesium oxide precursor 26p onto the zinc oxide thin film 24. The magnesium oxide thin film 26 may be an ultra thin film having a thickness of 0.1 nm to 2 nm and, in this case, the third pinholes 26a penetrating through the magnesium oxide thin film 26 may be generated. Stochastically, a possibility of misalignment between the second and third pinholes 24a and 26a is much higher than a possibility of alignment therebetween.

Figure 3A:
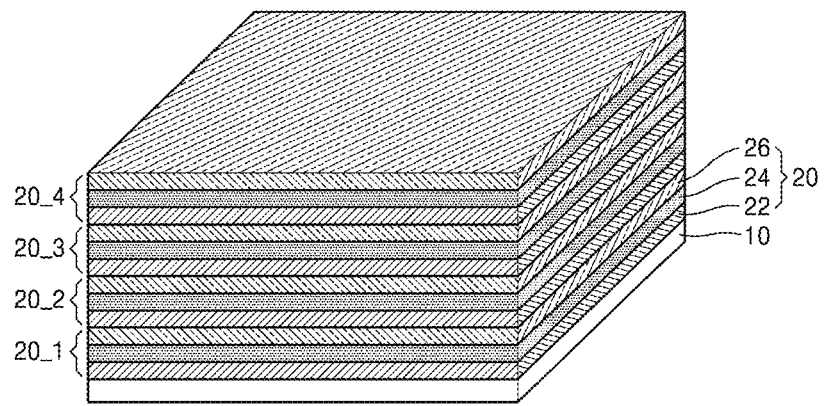
FIGS. 3A and 3B are perspective views of encapsulation structures for a transparent flexible organic electronic device, according to various embodiments of the present invention.
Figure 3B:
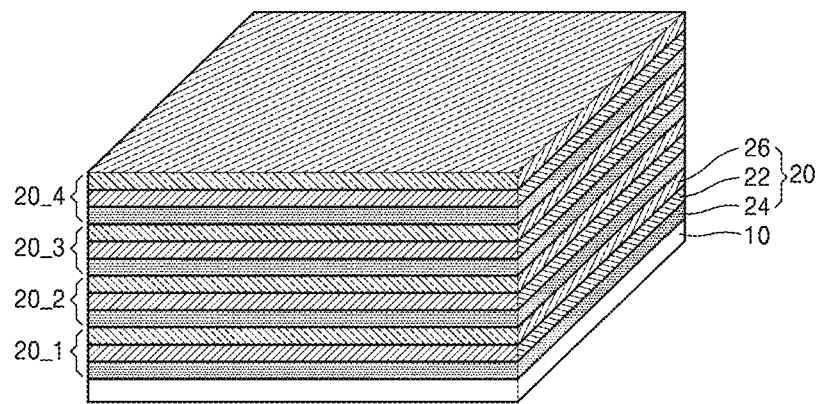

FIGS. 3A and 3B are perspective views of encapsulation structures for a transparent flexible organic electronic device, according to various embodiments of the present invention. The thicknesses of thin films and the pinhole decoupling structure according to the above descriptions are also applied to FIGS. 3A and 3B, but are not illustrated in FIGS. 3A and 3B for convenience sake.

Referring to FIG. 3A, each hybrid unit structure 20 of the encapsulation structure may include the aluminum oxide thin film 22, the zinc oxide thin film 24, and the magnesium oxide thin film 26 sequentially stacked on the flexible substrate 10.

Referring to FIG. 3B, each hybrid unit structure 20 of the encapsulation structure may include the zinc oxide thin film 24, the aluminum oxide thin film 22, and the magnesium oxide thin film 26 sequentially stacked on the flexible substrate 10.

Although not shown in FIGS. 3A and 3B, each hybrid unit structure 20 according to a modified embodiment of the present invention may include the aluminum oxide thin film 22, the zinc oxide thin film 24, and the magnesium oxide thin film 26 stacked on the flexible substrate 10 in an arbitrary order. For example, each hybrid unit structure 20 may include the magnesium oxide thin film 26, the aluminum oxide thin film 22, and the zinc oxide thin film 24 sequentially stacked on the flexible substrate 10.

A plurality of hybrid unit structures 20 may include two or more hybrid unit structures 20 having different configurations. For example, among the plurality of hybrid unit structures 20 of the encapsulation structure, the first hybrid unit structure 20_1 may include the aluminum oxide thin film 22, the zinc oxide thin film 24, and the magnesium oxide thin film 26 sequentially stacked on the flexible substrate 10, the second hybrid unit structure 20_2 may include the zinc oxide thin film 24, the aluminum oxide thin film 22, and the magnesium oxide thin film 26 sequentially stacked on the flexible substrate 10, the third hybrid unit structure 20_3 may include the aluminum oxide thin film 22, the magnesium oxide thin film 26, and the zinc oxide thin film 24 sequentially stacked on the flexible substrate 10, and the fourth hybrid unit structure 20_4 may include the magnesium oxide thin film 26, the aluminum oxide thin film 22, and the zinc oxide thin film 24 sequentially stacked on the flexible substrate 10.

Figure 4:
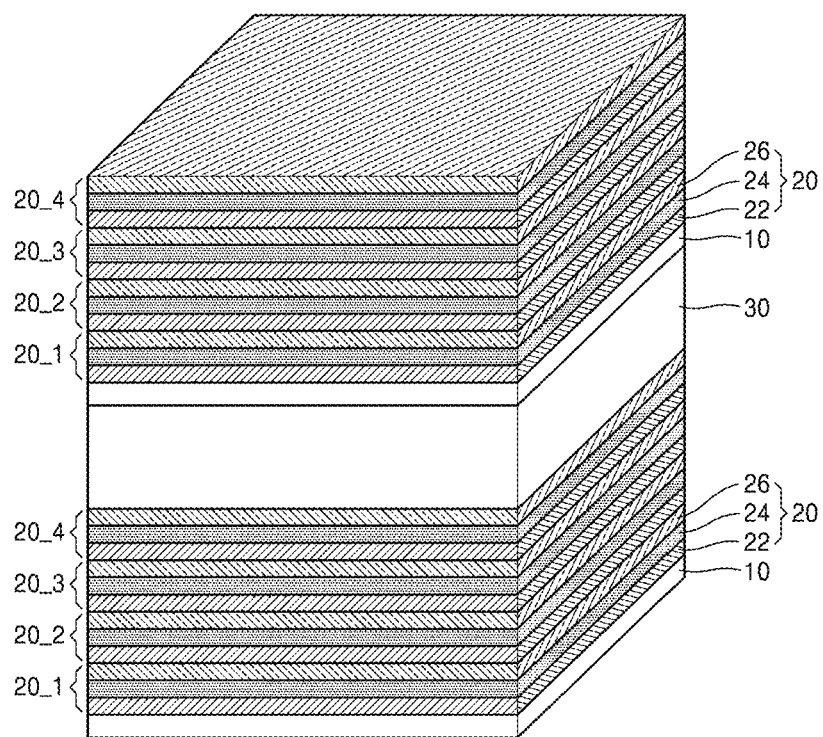
FIG. 4 is a perspective view of an encapsulation structure for a transparent flexible organic electronic device, according to another embodiment of the present invention.

FIG. 4 is a perspective view of an encapsulation structure for a transparent flexible organic electronic device, according to another embodiment of the present invention. The thicknesses of thin films and the pinhole decoupling structure according to the above descriptions are also applied to FIG. 4, but are not illustrated in FIG. 4 for convenience sake.

Referring to FIG. 4, the encapsulation structure further includes an organic thin film 30 on at least one of top and bottom surfaces of the hybrid unit structures 20. The organic thin film 30 may include at least one of parylene-based resin, polyethylene resin, polyimide resin, acryl-based resin, epoxy-based resin, and PMMA. The organic thin film 30 may have a thickness of 50 nm to 10 μm. A plurality of hybrid unit structures 20 located under the organic thin film 30 and a plurality of hybrid unit structures 20 located on the organic thin film 30 may have the configuration described above in relation to FIGS. 1 to 3.

A zero-stress encapsulation structure may be implemented by stacking an inorganic film including repeating unit structures, and a soft organic film a plurality of times as illustrated in FIG. 4. A functional encapsulation structure having thermal conductivity may be implemented by applying metal having a high thermal conductivity or a two-dimensional material such as graphene or carbon nanotubes (CNT), to the above-described encapsulation structure.

Figure 5A:
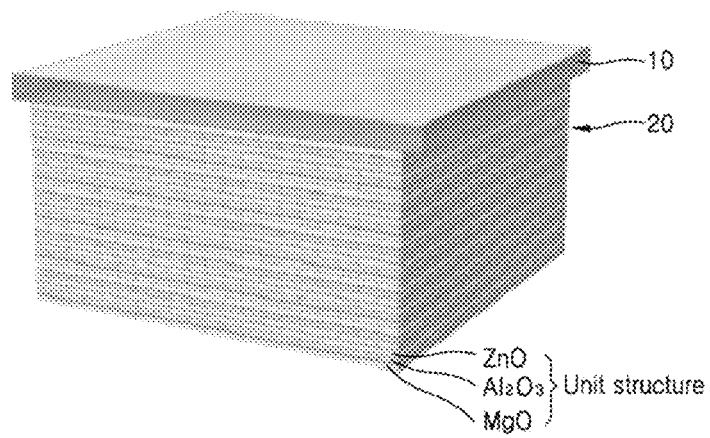
FIGS. 5A and 5B are perspective views showing a microcrack toughening phenomenon of an encapsulation structure for a transparent flexible organic electronic device, according to an embodiment of the present invention.
Figure 5B:
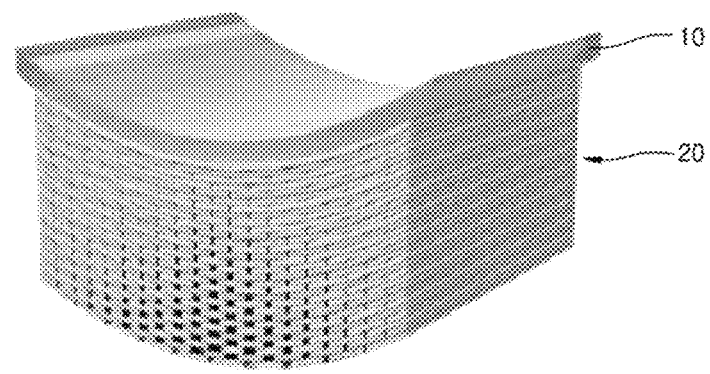

FIGS. 5A and 5B are perspective views showing a microcrack toughening phenomenon of an encapsulation structure for a transparent flexible organic electronic device, according to an embodiment of the present invention.

FIG. 5A shows a state in which external bending stress is not applied to the encapsulation structure according to an embodiment of the present invention, and FIG. 5B shows a state in which external bending stress is applied to the encapsulation structure according to an embodiment of the present invention.

Since the encapsulation structure according to an embodiment of the present invention includes a stack of a plurality of hybrid unit structures 20 each including a combination of ultra thin films having defects such as pinholes, when external bending stress is applied, mechanical characteristics of the encapsulation structure may be improved due to a microcrack toughening phenomenon.

The microcrack toughening phenomenon effect refers to an effect that, when a force is applied to a thin film in a direction passing through the thin film, localized energy carried by cracks in a thin film is safely spread to a large area such that internal stress is released and durability of the thin film is increased. This phenomenon is often observed in the nature. For example, teeth, bones, and shells of mollusks are made of very easily breakable materials, but are not easily breakable and highly durable due to structures thereof using the microcrack toughening phenomenon. The present inventor has invented and tested an ultra-thin-film stack structure capable of further improving physical characteristics of existing single aluminum oxide, magnesium oxide, and zinc oxide thin films having a high brittleness, by applying the phenomenon and model observed in the nature, to a barrier of an encapsulation film based on ALD technology. The inventor has found that a thin film including internal pinholes and/or voids and having a thickness of about 1 nm is generated by performing ALD, and that excellent barrier characteristics and mechanical characteristics are achievable by depositing repeated unit structures each including an aluminum oxide thin film, a magnesium oxide thin film, and a zinc oxide thin film each having a thickness of 1 nm.

FIGS. 6A to 6D are transmission electron microscopy (TEM) images of cross-sections of encapsulation structures for a transparent flexible organic electronic device, according to embodiments of the present invention.

FIG. 6A shows a case when each of a zinc oxide thin film, an aluminum oxide thin film, and a magnesium oxide thin film sequentially stacked on one another in a hybrid unit structure included in an encapsulation structure has a thickness of 0.25 nm, FIG. 6B shows a case when each of a zinc oxide thin film, an aluminum oxide thin film, and a magnesium oxide thin film sequentially stacked on one another in a hybrid unit structure included in an encapsulation structure has a thickness of 0.5 nm, FIG. 6C shows a case when each of a zinc oxide thin film, an aluminum oxide thin film, and a magnesium oxide thin film sequentially stacked on one another in a hybrid unit structure included in an encapsulation structure has a thickness of 1 nm, and FIG. 6D shows a case when each of a zinc oxide thin film, an aluminum oxide thin film, and a magnesium oxide thin film sequentially stacked on one another in a hybrid unit structure included in an encapsulation structure has a thickness of 2 nm. It is shown that a laminated structure of the hybrid unit structure is not observed on the TEM images of FIGS. 6A and 6B, but is observed on the TEM images of FIGS. 6C and 6D.

Figure 7:
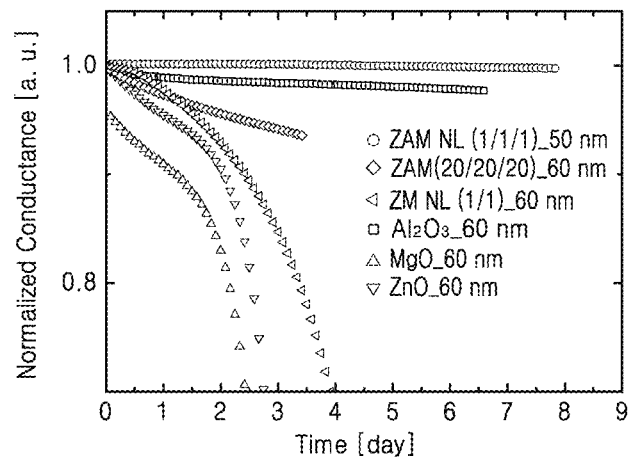
FIG. 7 is a graph showing a result of measuring barrier characteristics of encapsulation structures for a transparent flexible organic electronic device, according to embodiments and comparative examples of the present invention.

FIG. 7 is a graph showing a result of measuring barrier characteristics of encapsulation structures for a transparent flexible organic electronic device, according to embodiments and comparative examples of the present invention.

Item ○ indicates a case when an encapsulation structure includes a plurality of hybrid unit structures having a total thickness of 50 nm and each including a zinc oxide thin film, an aluminum oxide thin film, and a magnesium oxide thin film sequentially stacked on one another and each having a thickness of 1 nm.

Item ◇ indicates a case when an encapsulation structure includes a single hybrid unit structure having a total thickness of 60 nm and including a zinc oxide thin film, an aluminum oxide thin film, and a magnesium oxide thin film each having a thickness of 20 nm.

Item ◁ indicates a case when an encapsulation structure includes a plurality of hybrid unit structures having a total thickness of 60 nm and each including a zinc oxide thin film and a magnesium oxide thin film sequentially stacked on one another and each having a thickness of 1 nm.

Item □ indicates a case when an encapsulation structure includes a single aluminum oxide thin film having a thickness of 60 nm, item Δ indicates a case when an encapsulation structure includes a single magnesium oxide thin film having a thickness of 60 nm, and item ∇ indicates a case when an encapsulation structure includes a single zinc oxide thin film having a thickness of 60 nm.

Referring to FIG. 7, it is shown that the best barrier characteristics are achieved when the encapsulation structure includes a plurality of hybrid unit structures having a total thickness of 50 nm and each including a zinc oxide thin film, an aluminum oxide thin film, and a magnesium oxide thin film sequentially stacked on one another and each having a thickness of 1 nm.

Particularly, even when the hybrid unit structure of the encapsulation structure includes a zinc oxide thin film, an aluminum oxide thin film, and a magnesium oxide thin film, barrier characteristics of the case when the encapsulation structure includes a stack of a plurality of hybrid unit structures and each thin film has a very small thickness of 1 nm are much superior to those of the case when the encapsulation structure includes a single hybrid unit structure and each thin film has a thickness of 20 nm. It is understood that this is because the effect of the above-described pinhole decoupling structure is maximized.

Figure 8:
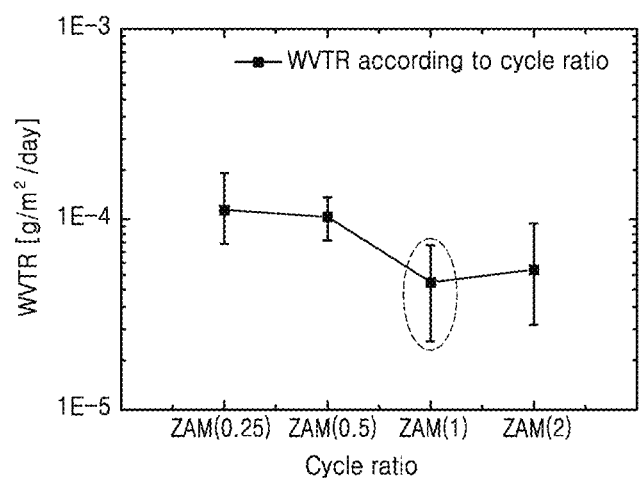
FIG. 8 is a graph showing a result of measuring moisture permeability of encapsulation structures for a transparent flexible organic electronic device, according to embodiments of the present invention.

FIG. 8 is a graph showing a result of measuring moisture permeability of encapsulation structures for a transparent flexible organic electronic device, according to embodiments of the present invention.

ZAM(0.25) indicates a case when a total thickness of a plurality of hybrid unit structures included in an encapsulation structure for a transparent flexible organic electronic device is 50 nm, and each of the hybrid unit structures includes a zinc oxide thin film, an aluminum oxide thin film, and a magnesium oxide thin film sequentially stacked on one another and each having a thickness of 0.25 nm, ZAM(0.5) indicates a case when a total thickness of a plurality of hybrid unit structures included in an encapsulation structure for a transparent flexible organic electronic device is 50 nm, and each of the hybrid unit structures includes a zinc oxide thin film, an aluminum oxide thin film, and a magnesium oxide thin film sequentially stacked on one another and each having a thickness of 0.5 nm, ZAM(1) indicates a case when a total thickness of a plurality of hybrid unit structures included in an encapsulation structure for a transparent flexible organic electronic device is 50 nm, and each of the hybrid unit structures includes a zinc oxide thin film, an aluminum oxide thin film, and a magnesium oxide thin film sequentially stacked on one another and each having a thickness of 1 nm, and ZAM(2) indicates a case when a total thickness of a plurality of hybrid unit structures included in an encapsulation structure for a transparent flexible organic electronic device is 50 nm, and each of the hybrid unit structures includes a zinc oxide thin film, an aluminum oxide thin film, and a magnesium oxide thin film sequentially stacked on one another and each having a thickness of 2 nm.

Referring to FIG. 8, it is shown that an excellent moisture permeability is achieved in all of the four cases and that, particularly, the best moisture permeability is achieved in the case when a total thickness of a plurality of hybrid unit structures included in an encapsulation structure for a transparent flexible organic electronic device is 50 nm, and each of the hybrid unit structures includes a zinc oxide thin film, an aluminum oxide thin film, and a magnesium oxide thin film sequentially stacked on one another and each having a thickness of 1 nm.

Figure 9:
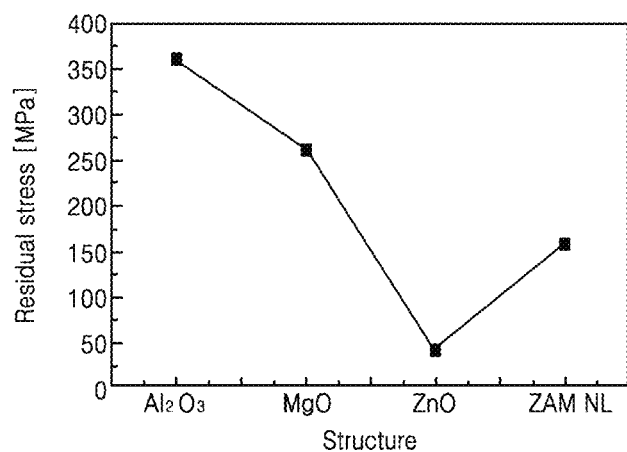
FIG. 9 is a graph showing a result of measuring residual stresses of films included in encapsulation structures for a transparent flexible organic electronic device, according to an embodiment and comparative examples of the present invention.

FIG. 9 is a graph showing a result of measuring residual stresses of films included in encapsulation structures for a transparent flexible organic electronic device, according to an embodiment and comparative examples of the present invention.

Referring to FIG. 9, it is shown that residual stress of a hybrid unit structure ZAM NL including a zinc oxide thin film, an aluminum oxide thin film, and a magnesium oxide thin film is lower than that of a single film such as an aluminum oxide thin film or a magnesium oxide thin film.

FIGS. 10A to 10D are graphs obtained by comparatively analyzing crystallinity of films included in encapsulation structures for a transparent flexible organic electronic device, according to an embodiment and comparative examples of the present invention.

Figure 10A:
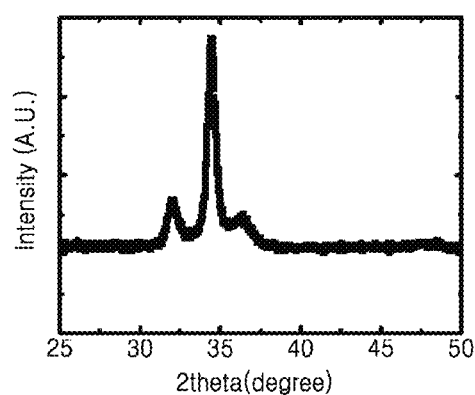
FIGS. 10A to 10D are graphs obtained by comparatively analyzing crystallinity of films included in encapsulation structures for a transparent flexible organic electronic device, according to an embodiment and comparative examples of the present invention.
Figure 10B:
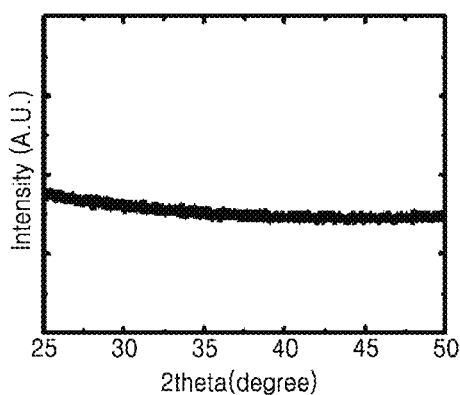
Figure 10C:
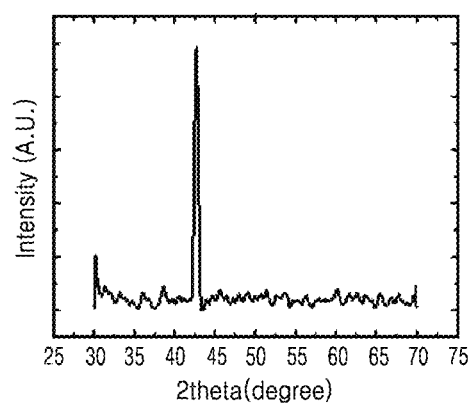
Figure 10D:
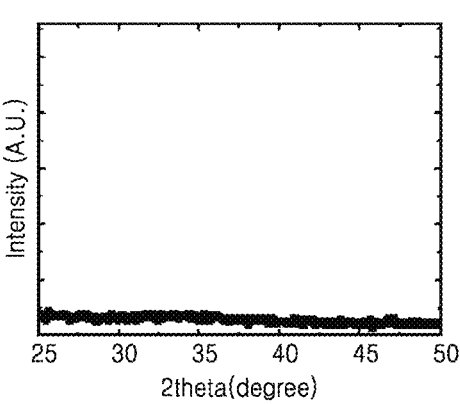

Referring to FIG. 10D, it is shown that amorphous characteristics are achieved when each of a plurality of hybrid unit structures of the encapsulation structure according to an embodiment of the present invention includes a zinc oxide thin film, an aluminum oxide thin film, and a magnesium oxide thin film sequentially stacked on one another. FIGS. 10A to 10C show crystallinity of known single films.

Referring to FIGS. 10A to 10D, based on the plurality of hybrid unit structures of the encapsulation structure according to an embodiment of the present invention, completely amorphous thin films may be produced and thus high-density thin films may be achieved compared to general single films by suppressing crystal growth of each thin film, and permeation of moisture and/or oxygen may become difficult by changing a moisture and/or oxygen permeation mechanism. In addition, since stress is distributed by pinholes in the thin films, flexibility may be increased. Furthermore, since different single materials are stacked as very thin films, hardness and an elastic modulus may be reduced and thus brittleness and flexibility may be increased. An encapsulation structure for a transparent flexible organic electronic device, which is produced using the above-described structure and material, may increase long-term reliability applicable to transparent flexible organic electronic devices based on various beneficial effects.

Figure 11A:
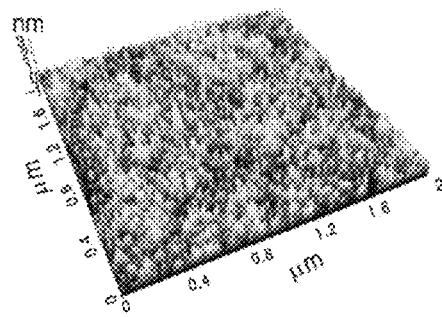
FIGS. 11A and 11B are images showing surface roughness of an $Al_2O_3$ thin film included in an encapsulation structure for a transparent flexible organic electronic device, according to an embodiment of the present invention, under various conditions.
Figure 11B:
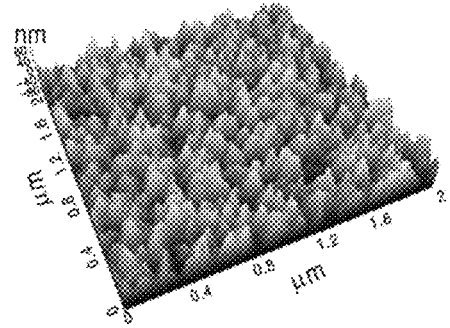

FIGS. 11A and 11B are images showing surface roughness of an aluminum oxide thin film included in an encapsulation structure for a transparent flexible organic electronic device, according to an embodiment of the present invention, under various conditions.

FIG. 11A shows surface roughness of the aluminum oxide thin film right after being deposited, and FIG. 11B shows surface roughness of the aluminum oxide thin film after being stored in a harsh constant temperature and humidity environment. Referring to FIGS. 11A and 11B, the aluminum oxide thin film having an amorphous structure may be crystallized due to molecular rearrangement and thus defects and channels capable of easily causing permeation of moisture and/or oxygen may be formed.

In spite of high barrier characteristics, since the aluminum oxide thin film is hydrolyzed in a high temperature and humidity environment, the aluminum oxide thin film having an amorphous structure are crystallized due to molecular rearrangement and thus defects and channels capable of easily causing permeation of moisture and/or oxygen are formed as shown in FIGS. 11A and 11B. To prevent hydrolysis of the aluminum oxide thin film, a moisture absorbing material such as a magnesium oxide thin film may be adopted and used as a sacrificial layer capable of absorbing permeating moisture and/or oxygen, and thus degradation due to hydrolysis may be delayed or reduced.

Figure 12A:
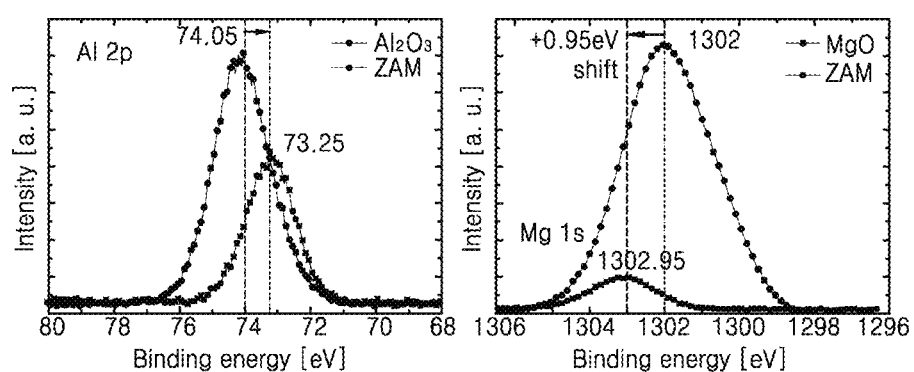
FIG. 12A includes X-ray photoelectron spectroscopy (XPS) graphs showing chemical binding due to a difference in electronegativity between aluminum (Al) and magnesium (Mg) at an $Al_2O_3$/MgO interface in an encapsulation structure for a transparent flexible organic electronic device, according to an embodiment of the present invention, compared to a comparative example.

FIG. 12A includes X-ray photoelectron spectroscopy (XPS) graphs showing chemical binding due to a difference in electronegativity between aluminum (Al) and magnesium (Mg) at an $Al_2O_3$/MgO interface in an encapsulation structure for a transparent flexible organic electronic device, according to an embodiment of the present invention, compared to a comparative example. In the graphs, item 'ZAM' indicates an encapsulation structure used for a transparent flexible organic electronic device and including a plurality of hybrid unit structures each including a zinc oxide thin film, an aluminum oxide thin film, and a magnesium oxide thin film sequentially stacked on one another, and item '$Al_2O_3$' indicates an encapsulation structure used for a transparent flexible organic electronic device and including a single aluminum oxide thin film.

Figure 12B:
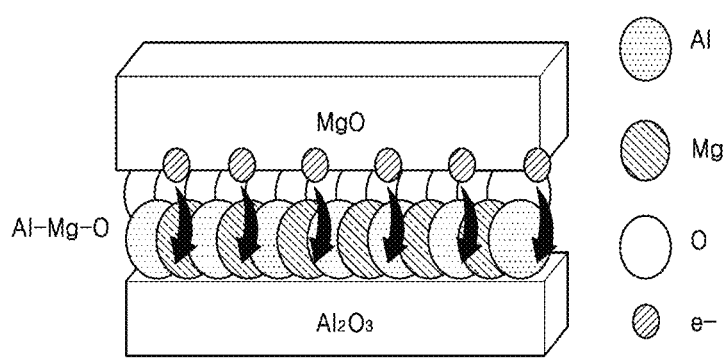
FIG. 12B is a conceptual view showing chemical binding due to a difference in electronegativity between Al and Mg at an $Al_2O_3$/MgO interface in an encapsulation structure for a transparent flexible organic electronic device, according to an embodiment of the present invention.

FIG. 12B is a conceptual view showing chemical binding due to a difference in electronegativity between Al and Mg at an $Al_2O_3$/MgO interface in an encapsulation structure for a transparent flexible organic electronic device, according to an embodiment of the present invention.

Referring to FIGS. 12A and 12B, when an $Al_2O_3$ sub-film and a MgO sub-film contact each other, chemical rebinding occurs at an interface therebetween and thus an aluminate phase is generated. Since such Al—Mg—O binding makes a thin film denser, barrier performance against moisture and oxygen may be improved. In addition, since such chemical binding increases resistance to moisture, environmental stability of the thin film may be increased.

The above-described configuration may be implemented in a structure in which an aluminum oxide thin film and a magnesium oxide thin film are stacked on one another to contact each other in each of a plurality of hybrid unit structures. The above-described configuration may also be implemented in a structure in which an aluminum oxide thin film of a first hybrid unit structure and a magnesium oxide thin film of a second hybrid unit structure are stacked on one another to contact each other at a boundary between the first and second hybrid unit structures in contact with each other.

Figure 13A:
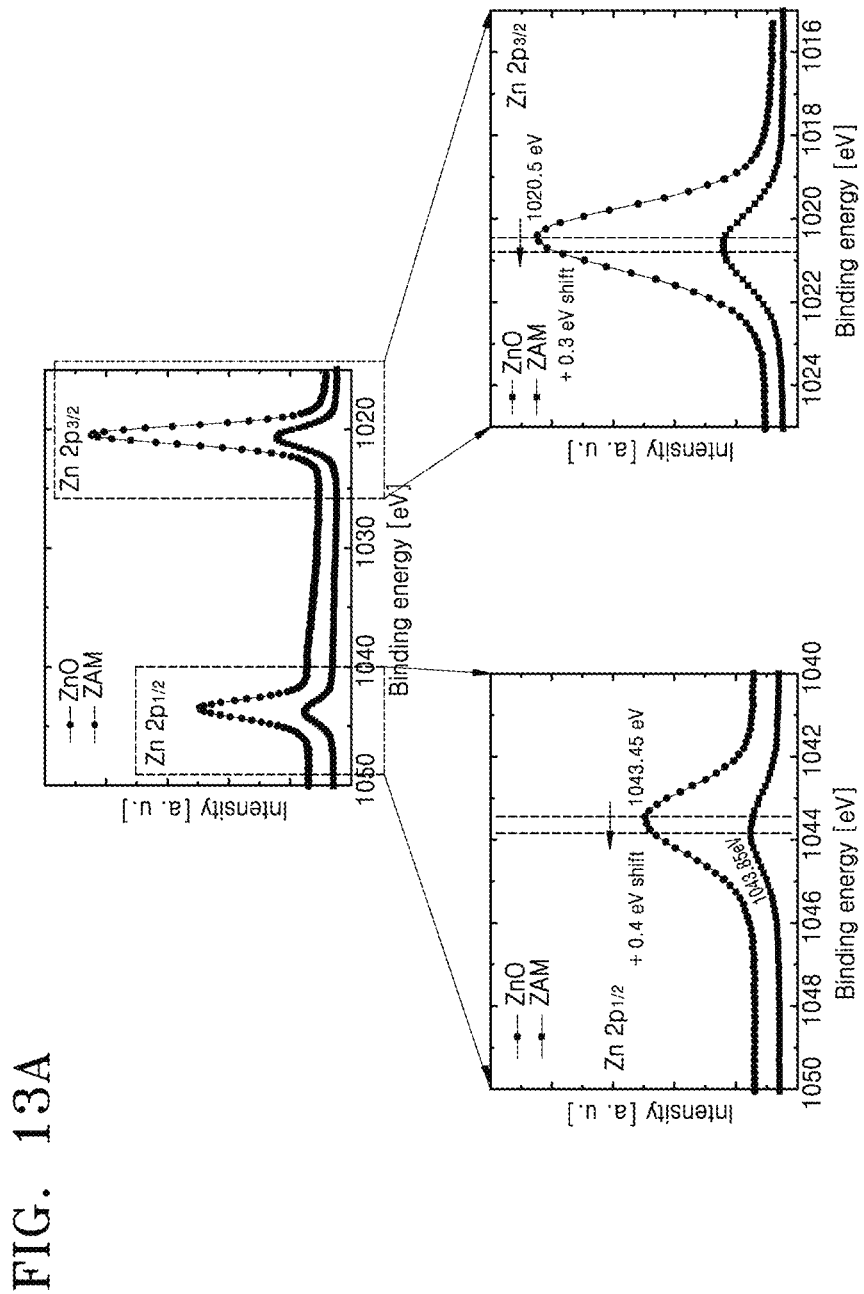
FIG. 13A includes XPS graphs showing binding due to trimethylaluminum (TMA) and chemical etching on the surface of ZnO at an $Al_2O_3$/ZnO interface in an encapsulation structure for a transparent flexible organic electronic device, according to an embodiment of the present invention.

FIG. 13A includes XPS graphs showing binding due to trimethylaluminum (TMA) and chemical etching on the surface of ZnO at an $Al_2O_3$/ZnO interface in an encapsulation structure for a transparent flexible organic electronic device, according to an embodiment of the present invention. In the graphs, item 'ZAM' indicates an encapsulation structure used for a transparent flexible organic electronic device and including a plurality of hybrid unit structures each including a zinc oxide thin film, an aluminum oxide thin film, and a magnesium oxide thin film sequentially stacked on one another, and item 'ZnO' indicates an encapsulation structure used for a transparent flexible organic electronic device and including a single zinc oxide thin film.

Figure 13B:
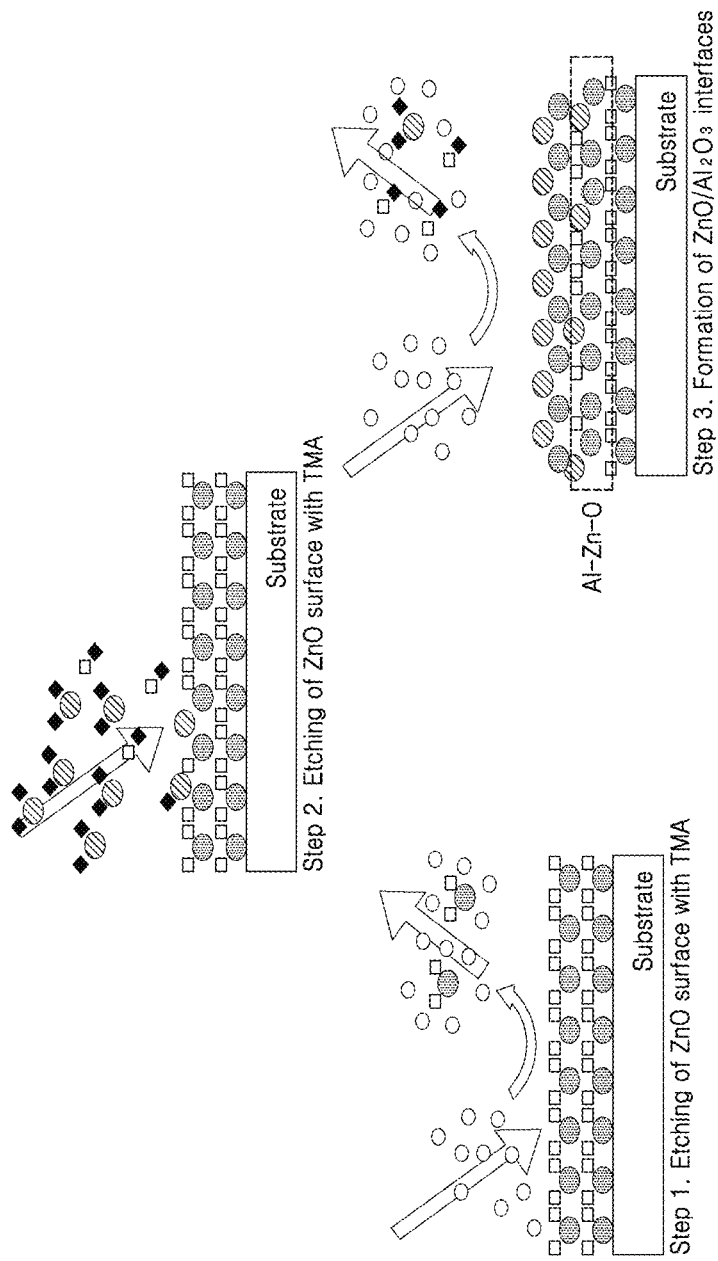
FIG. 13B is a conceptual view showing binding due to TMA and chemical etching on the surface of ZnO at an $Al_2O_3$/ZnO interface in an encapsulation structure for a transparent flexible organic electronic device, according to an embodiment of the present invention.

FIG. 13B is a conceptual view showing binding due to TMA and chemical etching on the surface of ZnO at an $Al_2O_3$/ZnO interface in an encapsulation structure for a transparent flexible organic electronic device, according to an embodiment of the present invention.

Referring to FIGS. 13A and 13B, TMA is a precursor used to produce $Al_2O_3$ in atomic layer deposition (ALD). Since TMA etches the surface of pre-formed ZnO, chemical binding may occur at the ZnO/$Al_2O_3$ interface. That is, Al—Zn—O binding may occur at the ZnO/$Al_2O_3$ interface. It is shown that such chemical binding effectively serves to improve barrier performance of the encapsulation structure for a transparent flexible organic electronic device.

The above-described configuration may be implemented in a structure in which a zinc oxide thin film and an aluminum oxide thin film are stacked on one another to contact each other in each of a plurality of hybrid unit structures. The above-described configuration may also be implemented in a structure in which a zinc oxide thin film of a first hybrid unit structure and an aluminum oxide thin film of a second hybrid unit structure are stacked on one another to contact each other at a boundary between the first and second hybrid unit structures in contact with each other.

Figure 14:
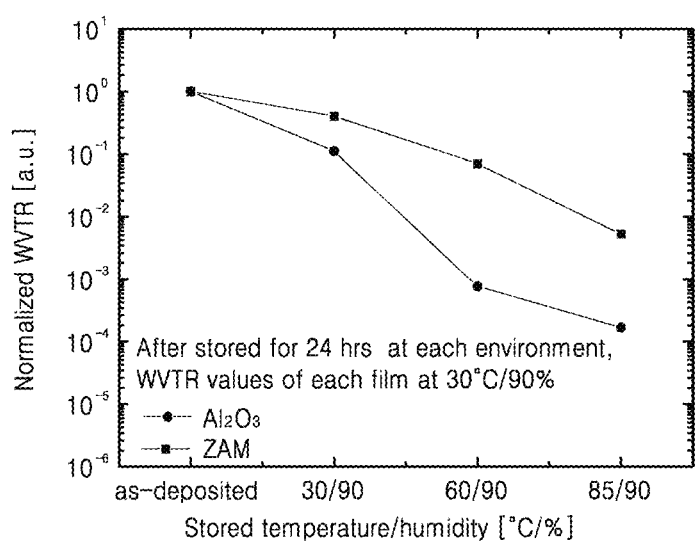
FIG. 14 is a moisture permeability graph showing variations in barrier performance of an encapsulation structure for a transparent flexible organic electronic device, according to an embodiment of the present invention, and a single $Al_2O_3$ thin film after being stored in various constant temperature and humidity environments.

FIG. 14 is a moisture permeability graph showing variations in barrier performance of an encapsulation structure for a transparent flexible organic electronic device, according to an embodiment of the present invention, and a single $Al_2O_3$ thin film after being stored in various constant temperature and humidity environments. In the graph, item 'ZAM' indicates an encapsulation structure used for a transparent flexible organic electronic device and including a plurality of hybrid unit structures each including a zinc oxide thin film, an aluminum oxide thin film, and a magnesium oxide thin film sequentially stacked on one another, and item '$Al_2O_3$' indicates an encapsulation structure used for a transparent flexible organic electronic device and including a single aluminum oxide thin film. A normalized water vapor transmission rate (WVTR) of a vertical axis corresponds to a ratio between a WVTR value of an as-deposited thin film and a WVTR value of a thin film stored in a specific temperature and humidity environment (Normalized WVTR=$WVTR_{as\text{-}deposited}/WVTR_{temp/humid}$). As the storage environment becomes harsher, the WVTR value is increased and thus the normalized WVTR value is reduced.

By greatly reducing a proportion of an $Al_2O_3$ thin film based on a nanolaminate system and chemical binding described above in relation to FIGS. 12A to 13B, environmental stability of the encapsulation structure of the present invention is greatly increased. As shown in FIG. 14, the single aluminum oxide thin film shows great degradation of barrier performance in an environment of 60° C./90%, but the encapsulation structure (ZAM) of the present invention shows much less degradation of barrier performance. The encapsulation structure structurally and materially designed as described above may not only increase reliability of an encapsulation film but also much more stably protect the organic electronic device.

Figure 15:
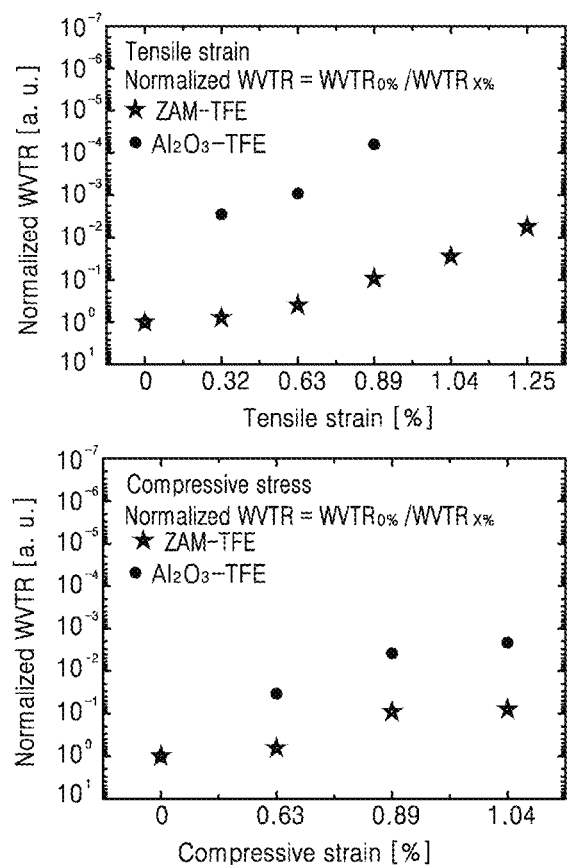
FIG. 15 includes graphs showing results of measuring moisture permeability based on bending tests of various intensities of tensile and compressive stress on multi-barriers produced using an encapsulation structure for a transparent flexible organic electronic device, according to an embodiment of the present invention, and $Al_2O_3$ together with an organic material.

FIG. 15 includes graphs showing results of measuring moisture permeability based on bending tests of various intensities of tensile and compressive stress on multi-barriers produced using an encapsulation structure for a transparent flexible organic electronic device, according to an embodiment of the present invention, and $Al_2O_3$ together with an organic material. Specifically, the left graph shows a result of measuring moisture permeability based on a bending test of tensile stress, and the right graph shows a result of measuring moisture permeability based on a bending test of compressive stress. In the graphs, item 'ZAM-TFE' indicates an encapsulation structure used for a transparent flexible organic electronic device and including a plurality of hybrid unit structures each including a zinc oxide thin film, an aluminum oxide thin film, and a magnesium oxide thin film sequentially stacked on one another, and item '$Al_2O_3$-TFE' indicates an encapsulation structure used for a transparent flexible organic electronic device and including a single aluminum oxide thin film. A normalized WVTR of a vertical axis corresponds to a ratio between a WVTR value of a thin film having a strain of 0% and a WVTR value of a thin film having an arbitrary strain of x % greater than 0% (Normalized WVTR=$WVTR_{0\%}/WVTR_{x\%}$). As the strain is increased, the WVTR value is increased and thus the normalized WVTR value is reduced.

Table 1 shows a result of measuring WVTR values [g/m²/day] of the encapsulation structure ZAM-TFE of the present invention and the encapsulation structure $Al_2O_3$-TFE configured as the known $Al_2O_3$-based multi-barrier, based on bending tests of tensile and compressive stress.

TABLE 1

| | ZAM-TFE | | $Al_2O_3$-TFE | |
|---|---|---|---|---|
| Strain | Tensile stress | Compressive stress | Tensile stress | Compressive stress |
| 0% | $2.44 \times 10^{-6}$ | — | $7.59 \times 10^{-5}$ | — |
| 0.31% | $4.62 \times 10^{-6}$ | — | $2.58 \times 10^{-3}$ | — |
| 0.63% | $8.20 \times 10^{-6}$ | $6.23 \times 10^{-6}$ | $2.11 \times 10^{-2}$ | $9.64 \times 10^{-4}$ |
| 0.89% | $2.65 \times 10^{-5}$ | $2.29 \times 10^{-5}$ | $7.42 \times 10^{-2}$ | $6.97 \times 10^{-3}$ |
| 1.04% | $9.78 \times 10^{-5}$ | $5.42 \times 10^{-5}$ | — | $1.98 \times 10^{-2}$ |
| 1.25% | $4.39 \times 10^{-4}$ | — | — | — |

When a transparent flexible organic electronic device is produced, mechanical characteristics of an encapsulation structure also needs to be significantly considered. Since moisture and oxygen have diameters equal to or less than 1 nm and thus may easily permeate through fine defects and cracks, production of an encapsulation film having excellent mechanical characteristics is important. FIG. 15 comparatively shows mechanical characteristics of the encapsulation structure ZAM-TFE of the present invention and the encapsulation structure $Al_2O_3$-TFE configured as the known $Al_2O_3$-based multi-barrier, and shows variations in the mechanical characteristics in various directions and at various intensities of stress. The known $Al_2O_3$-based multi-barrier shows a rapid increase in WVTR at a tensile strain of 0.3% to 0.6%. However, the multi-barrier of the encapsulation structure of the present invention shows degradation of barrier performance at a tensile strain of about 1% but maintains a WVTR value of about $10^{-4}$ g/m²/day. An inorganic film capable of withstanding a bending strain of about 1% has been rarely reported, and it is found that the above-described structural and material design may greatly improve not only barrier performance but also mechanical characteristics.

Figure 16A:
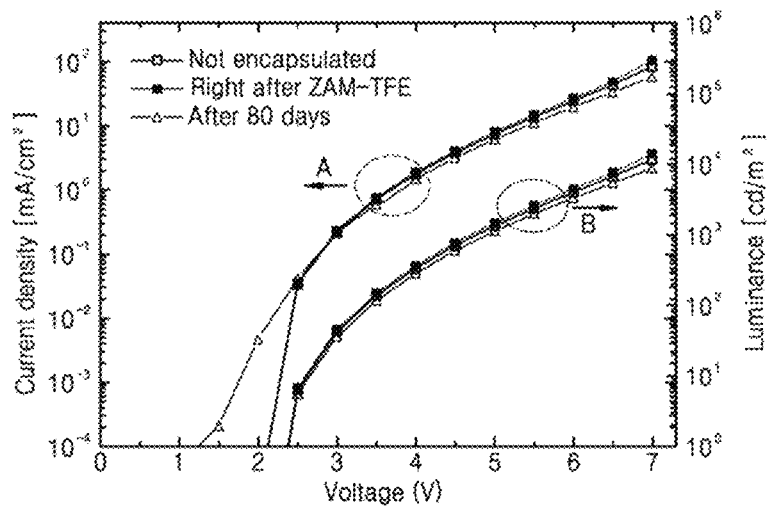
FIGS. 16A to 16C are diagrams showing characteristics, lifetimes, and cell image variations of an organic light-emitting diode (OLED) using an encapsulation structure for a transparent flexible organic electronic device, according to an embodiment of the present invention.
Figure 16B:
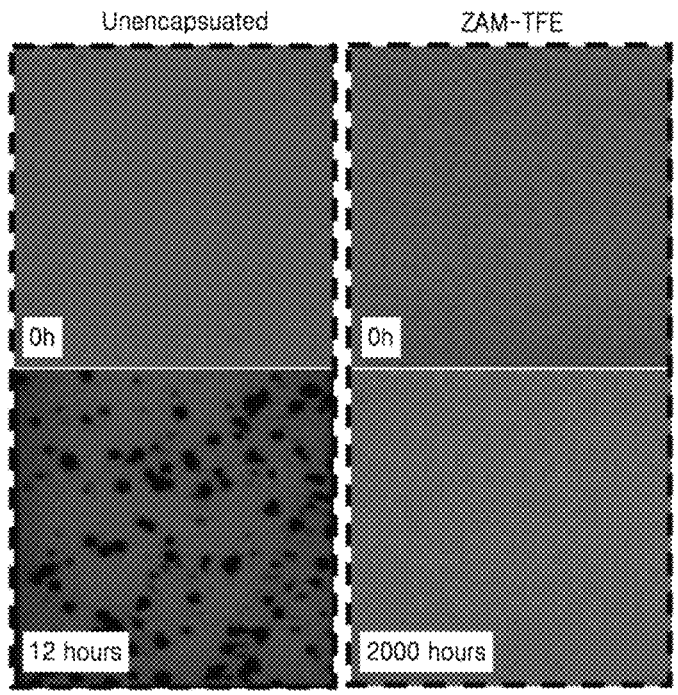
Figure 16C:
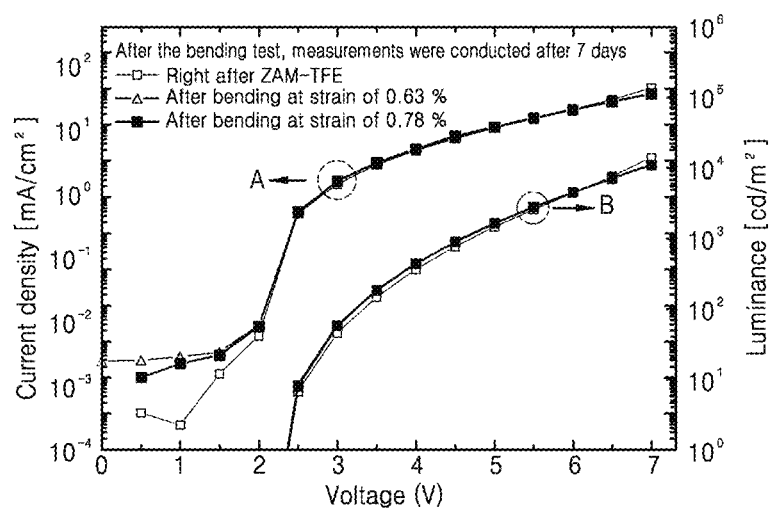

FIGS. 16A to 16C are diagrams showing characteristics, lifetimes, and cell image variations of an organic light-emitting diode (OLED) using an encapsulation structure for a transparent flexible organic electronic device, according to an embodiment of the present invention. Specifically, in FIG. 16A, left lines A relate to a current density of the OLED and right lines B relate to luminance of the OLED in a case when no encapsulation structure is formed (Not encapsulated), a case right after an encapsulation structure used for a transparent flexible organic electronic device and including a plurality of hybrid unit structures each including a zinc oxide thin film, an aluminum oxide thin film, and a magnesium oxide thin film sequentially stacked on one another is formed (Right after ZAM-TFE), and a case after 80 days from when the encapsulation structure is formed (After 80 days). In FIG. 16B, left optical microscope images show permeation of moisture or oxygen based on time in the OLED using no encapsulation structure, and right optical microscope images show permeation of moisture or oxygen based on time in the OLED using the encapsulation structure ZAM-TFE. In FIG. 16C, left lines A relate to a current density of the OLED and right lines B relate to luminance of the OLED in a case right after an encapsulation structure used for a transparent flexible organic electronic device and including a plurality of hybrid unit structures each including a zinc oxide thin film, an aluminum oxide thin film, and a magnesium oxide thin film sequentially stacked on one another is formed (Right after ZAM-TFE), a case after bending at a strain of 0.63%, and a case after bending at a strain of 0.78%.

That is, to verify applicability of the transparent flexible encapsulation structure of the present invention to an actual organic electronic device based on characteristics evaluation thereof, the encapsulation structure is applied to an actual device and characteristics thereof are evaluated. Since no variation occurs in electrical characteristics before and after the encapsulation structure of the present invention is applied, it is verified that the process of the encapsulation structure does not cause any problem in the organic electronic device. Furthermore, by comparing device performances and cell images before and after the organic electronic device using the encapsulation structure of the present invention is stored for 80 days at room temperature, it is verified that the encapsulation structure effectively protects the device from an external environment. In addition, the bending tests of the device using the encapsulation structure show that the encapsulation structure has bending characteristics sufficient to be used as an encapsulation film of a transparent flexible organic electronic device. In the comparative encapsulation structure using the known $Al_2O_3$-based multi-barrier, cracks occur due to bending, and characteristics and performance of an organic electronic device are not measured.

An encapsulation structure for a transparent flexible organic electronic device, according to an embodiment of the present invention, has been described above.

In brief, the present invention relates to a multilayer encapsulation film for producing a transparent flexible organic device, and a method of manufacturing the same. Since an organic device (e.g., an OLED) generally includes a metal electrode and an organic material which are sensitive to moisture and/or oxygen, dark spots easily occur due to reaction with moisture and/or oxygen during operation and thus device performance is lowered. Therefore, a protective layer capable of ensuring stable operation and lifetime without degradation for a long time is required.

In an encapsulation structure for a transparent flexible organic electronic device, according to an embodiment of the present invention, since multiple thin films having effective advantages to produce an encapsulation film for a multifunctional organic device are used together, disadvantages of the thin films may be canceled. Furthermore, barrier characteristics may be greatly improved by providing a hybrid film in which very thin films having defects therein are stacked on one another.

For example, since a hybrid thin film having defects is produced by sequentially stacking ZnO, $Al_2O_3$, and MgO, a thin film capable of not only achieving high barrier characteristics corresponding to a WVTR value of $10^{-6}$ g/m$^2$/day but also achieving a high transmittance equal to or greater than 95%, a high flexibility, and a zero stress may be implemented. Advantages of the materials used for the ZnO/$Al_2O_3$/MgO hybrid thin film are as described below. The $Al_2O_3$ thin film is used to improve barrier characteristics in the hybrid thin film. Since the hybrid thin film includes different very thin films having pinholes and sequentially stacked on one other as illustrated in FIG. 2, permeation of very small moisture and/or oxygen molecules may be facilitated and thus barrier characteristics may be reduced. In general, pinholes formed due to defects of thin films grow from original locations thereof. When a large number of very thin films having the above problem are stacked on one another, a defect decoupling phenomenon in which pinholes and defects of the films are misaligned occurs and, consequently, permeation of moisture and/or oxygen may be greatly slowed down as illustrated in FIG. 1, thereby achieving a moisture permeation mechanism different from that of a thin film including a single material. Furthermore, moisture absorbing films interposed between other thin films contribute to improvement in barrier characteristics by absorbing moisture. The graph of FIG. 7 shows a result of measuring WVTR values of thin films by using a calcium (Ca) test method. When a single MgO thin film, a single ZnO thin film, and a hybrid ZnO/MgO thin film having equal thicknesses are compared, although a certain level of improvement in barrier characteristics is shown, the hybrid thin film may not achieve sufficient improvement in barrier characteristics above the certain level. To solve this problem, a ZnO/$Al_2O_3$/MgO structure is produced using an $Al_2O_3$ thin film known as having good barrier characteristics, and is tested. Improvement in barrier characteristics by more than 100 times that of the ZnO/MgO structure is shown due to $Al_2O_3$. As described above, application of a main barrier material is needed to design a hybrid thin film. The ZnO thin film helps to reduce stress of the hybrid thin film and, at the same time, the surface thereof is etched at an $Al_2O_3$/ZnO interface by trimethylaluminum (TMA) used to form $Al_2O_3$. Since deposition occurs simultaneously with the etching, a strong bonding is provided between $Al_2O_3$ and ZnO and thus the barrier function is enhanced.

A defect-distributed high-density film produced as described above by stacking ultra thin films greatly differs from known single films in a double flexibility effect in which flexible characteristics are provided due to a low elastic modulus and a low hardness value by solving brittleness of the single films, and flexibility of the encapsulation film is increased based on stress distribution due to defects distributed in the films. Based on the above measurement results and various theories, the encapsulation film proposed by the present invention may solve degradation problems (e.g., low barrier characteristics and hydrolysis) of known encapsulation films and structures by stacking various functional thin films on one another. At the same time, due to the multilayer defect-distributed structure for stable application to flexible devices, the elastic modulus and the hardness may be reduced, stress may be efficiently distributed due to defects distributed in the films, and thus an encapsulation film applicable to the industry may be produced.

The above-described $Al_2O_3$ thin film 22 may be understood as a barrier film, and the barrier film may be the $Al_2O_3$ thin film 22 or a thin film including at least one of AlN, $AlO_xN_y$, and $SnO_x$.

The above-described ZnO thin film 24 may be understood as a stress relief film, and the stress relief film may be the ZnO thin film 24 or a thin film including at least one selected among $SiO_2$, $SiN_x$, silver (Ag), and aluminum (Al).

The above-described the MgO thin film 26 may be understood as a moisture absorbing film, and the moisture absorbing film may be the MgO thin film 26 or a thin film including at least one selected among alkali metals (e.g., lithium (Li), sodium (Na), potassium (K), rubidium (Rb), cesium (Cs), and francium (Fr)), alkaline earth metals (e.g., beryllium (Be), calcium (Ca), strontium (Sr), barium (Ba), and radium (Ra)), titanium (Ti), zirconium (Zr), hafnium (Hf), and oxides thereof.

According to the afore-described embodiments of the present invention, an encapsulation structure used for a transparent flexible organic electronic device and capable of not only achieving high barrier characteristics corresponding to a low WVTR value but also achieving a high transmittance equal to or greater than 95%, a high flexibility, and a low stress may be provided While the present invention has been particularly shown and described with reference to embodiments thereof, it will be understood by one of ordinary skill in the art that various changes in form and details may be made therein without departing from the scope of the present invention as defined by the following claims.

What is claimed is:

1. An encapsulation structure for a transparent flexible organic electronic device, the encapsulation structure comprising:
    a flexible substrate;
    at least one hybrid unit structure provided on at least one surface of the flexible substrate and comprising a zinc oxide thin film, an aluminum oxide thin film, and a magnesium oxide thin film stacked on one another,
    wherein, in the at least one hybrid unit structure, the zinc oxide thin film, the aluminum oxide thin film, and the magnesium oxide thin film individually have pinholes, and have a pinhole decoupling structure in which the pinholes of adjacent thin films among the zinc oxide thin film, the aluminum oxide thin film, and the magnesium oxide thin film are misaligned.

2. The encapsulation structure of claim 1, wherein, in the at least one hybrid unit structure, the aluminum oxide thin film and the magnesium oxide thin film are stacked on one another to contact each other.

3. The encapsulation structure of claim 1, wherein, in the at least one hybrid unit structure, the zinc oxide thin film and the aluminum oxide thin film are stacked on one another to contact each other in such a manner that the zinc oxide thin film is located at a lower side and the aluminum oxide thin film is located at an upper side.

4. The encapsulation structure of claim 1, wherein the at least one hybrid unit structure comprises a first hybrid unit structure and a second hybrid unit structure in contact with each other, and
    wherein the aluminum oxide thin film of the first hybrid unit structure and the magnesium oxide thin film of the second hybrid unit structure are stacked on one another to contact each other at a boundary between the first hybrid unit structure and the second hybrid unit structure.

5. The encapsulation structure of claim 1, wherein the at least one hybrid unit structure comprises a first hybrid unit structure and a second hybrid unit structure in contact with each other, and
    wherein the zinc oxide thin film of the first hybrid unit structure and the aluminum oxide thin film of the second hybrid unit structure are stacked on one another to contact each other at a boundary between the first hybrid unit structure and the second hybrid unit structure in such a manner that the zinc oxide thin film is located at a lower side and the aluminum oxide thin film is located at an upper side.

6. The encapsulation structure of claim 1, wherein the zinc oxide thin film comprises a ZnO thin film,
    wherein the aluminum oxide thin film comprises an $Al_2O_3$ thin film, and
    wherein the magnesium oxide thin film comprises a MgO thin film.

7. The encapsulation structure of claim 1, wherein, in a hybrid unit structure, the aluminum oxide thin film is an ultra thin film having pinholes and having a thickness of 0.1 nm to 2 nm, the magnesium oxide thin film is an ultra thin film having pinholes and having a thickness of 0.1 nm to 2 nm, and the zinc oxide thin film is an ultra thin film having pinholes and having a thickness of 0.1 nm to 30 nm.

8. The encapsulation structure of claim 1, wherein the flexible substrate comprises at least one of a polymer substrate, a fiber substrate, and a fabric substrate.

9. The encapsulation structure of claim 1, further comprising an organic thin film provided on at least one of top and bottom surfaces of the hybrid unit structure.

10. The encapsulation structure of claim 9, wherein the organic thin film comprises at least one of parylene-based resin, polyethylene resin, polyimide resin, acryl-based resin, epoxy-based resin, and polymethyl methacrylate (PMMA).

11. An encapsulation structure for a transparent flexible organic electronic device, the encapsulation structure comprising:
    a flexible substrate; and
    at least one hybrid unit structure provided on at least one surface of the flexible substrate and comprising a zinc oxide thin film, an aluminum oxide thin film, and a magnesium oxide thin film stacked on one another,
    wherein the at least one hybrid unit structure comprises a plurality of hybrid unit structures, and wherein a pinhole decoupling structure occurs at a boundary between the hybrid unit structures such that pinholes of a hybrid unit structure are misaligned with pinholes of an adjacent hybrid unit structure.

12. An encapsulation structure for a transparent flexible organic electronic device, the encapsulation structure comprising:
    a flexible substrate; and
    at least one hybrid unit structure provided on at least one surface of the flexible substrate and comprising a stress relief film, a barrier film, and a moisture absorbing film stacked on one another,
    wherein, in the at least one hybrid unit structure, the stress relief film, the barrier film, and the moisture absorbing film individually have pinholes, and have a pinhole decoupling structure in which the pinholes of adjacent thin films among the stress relief film, the barrier film, and the moisture absorbing film are misaligned.

13. The encapsulation structure of claim 12, wherein the barrier film is a thin film comprising at least one of AlN, $Al_2O_3$, AlOxNy, and SnOx,
    wherein the moisture absorbing film is a thin film comprising at least one selected among alkali metals comprising lithium (Li), sodium (Na), potassium (K), rubidium (Rb), cesium (Cs), and francium (Fr), alkaline earth metals comprising beryllium (Be), magnesium (Mg), calcium (Ca), strontium (Sr), barium (Ba), and radium (Ra), titanium (Ti), zirconium (Zr), hafnium (Hf), and oxides thereof, and
    wherein the stress relief film is a thin film comprising at least one selected among ZnO, $SiO_2$, SiNx, silver (Ag), and aluminum (Al).

14. The encapsulation structure of claim 12, wherein, in a hybrid unit structure, the barrier film is an ultra thin film having a thickness of 0.1 nm to 2 nm, the moisture absorbing film is an ultra thin film having a thickness of 0.1 nm to 2 nm, and the stress relief film is an ultra thin film having a thickness of 0.1 nm to 30 nm.

15. The encapsulation structure of claim 12, wherein the at least one hybrid unit structure comprises a plurality of hybrid unit structures, and
    wherein a pinhole decoupling structure occurs at a boundary between the hybrid unit structures such that pinholes of a hybrid unit structure are misaligned with pinholes of an adjacent hybrid unit structure.

16. A method of manufacturing an encapsulation structure for a transparent flexible organic electronic device, the method comprising:

generating, on at least one surface of a flexible substrate, at least one hybrid unit structure comprising a zinc oxide thin film, an aluminum oxide thin film, and a magnesium oxide thin film stacked on one another, wherein the zinc oxide thin film is generated using atomic layer deposition (ALD), chemical vapor deposition (CVD), molecular layer deposition (MLD), or physical vapor deposition (PVD), wherein the aluminum oxide thin film is generated using ALD, CVD, MLD, or PVD, wherein the magnesium oxide thin film is generated using ALD, CVD, MLD, or PVD, wherein, in a hybrid unit structure, the aluminum oxide thin film is an ultra thin film having pinholes and having a thickness of 0.1 nm to 2 nm, the magnesium oxide thin film is an ultra thin film having pinholes and having a thickness of 0.1 nm to 2 nm, and the zinc oxide thin film is an ultra thin film having pinholes and having a thickness of 0.1 nm to 30 nm, and wherein, in the at least one hybrid unit structure, the zinc oxide thin film, the aluminum oxide thin film, and the magnesium oxide thin film have a pinhole decoupling structure in which pinholes of adjacent thin films among the zinc oxide thin film, the aluminum oxide thin film, and the magnesium oxide thin film are misaligned.

17. The method of claim 16, wherein the zinc oxide thin film comprises a ZnO thin film, wherein the aluminum oxide thin film comprises an $Al_2O_3$ thin film, and wherein the magnesium oxide thin film comprises a MgO thin film.

18. A method of manufacturing an encapsulation structure for a transparent flexible organic electronic device, the method comprising:

generating, on at least one surface of a flexible substrate, at least one hybrid unit structure comprising a zinc oxide thin film, an aluminum oxide thin film, and a magnesium oxide thin film stacked on one another, wherein the zinc oxide thin film is generated using atomic layer deposition (ALD), chemical vapor deposition (CVD), molecular layer deposition (MLD), or physical vapor deposition (PVD), wherein the aluminum oxide thin film is generated using ALD, CVD, MLD, or PVD, wherein the magnesium oxide thin film is generated using ALD, CVD, MLD, or PVD, wherein, in a hybrid unit structure, the aluminum oxide thin film is an ultra thin film having pinholes and having a thickness of 0.1 nm to 2 nm, the magnesium oxide thin film is an ultra thin film having pinholes and having a thickness of 0.1 nm to 2 nm, and the zinc oxide thin film is an ultra thin film having pinholes and having a thickness of 0.1 nm to 30 nm, wherein the at least one hybrid unit structure comprises a plurality of hybrid unit structures, and wherein a pinhole decoupling structure occurs at a boundary between the hybrid unit structures such that pinholes of a hybrid unit structure are misaligned with pinholes of an adjacent hybrid unit structure.

* * * * *